(12) United States Patent
Zonte et al.

(10) Patent No.: US 10,998,019 B2
(45) Date of Patent: May 4, 2021

(54) LOW STANDBY POWER WITH FAST TURN ON METHOD FOR NON-VOLATILE MEMORY DEVICES

(71) Applicant: LONGITUDE FLASH MEMORY SOLUTIONS LTD, Dublin (IE)

(72) Inventors: Cristinel Zonte, Colorado Springs, CO (US); Vijay Raghavan, Colorado Springs, CO (US); Iulian C. Gradinariu, Colorado Springs, CO (US); Gary Peter Moscaluk, Colorado Springs, CO (US); Roger Bettman, Los Altos, CA (US); Vineet Argrawal, San Jose, CA (US); Samuel Leshner, Los Gatos, CA (US)

(73) Assignee: Longitude Flash Memory Solutions, Ltd., Dublin (IE)

( * ) Notice: Subject to any disclaimer, the term of this patent is extended or adjusted under 35 U.S.C. 154(b) by 0 days.

(21) Appl. No.: 16/715,412

(22) Filed: Dec. 16, 2019

(65) Prior Publication Data
US 2020/0234746 A1   Jul. 23, 2020

Related U.S. Application Data

(63) Continuation of application No. 16/055,570, filed on Aug. 6, 2018, now Pat. No. 10,510,387, which is a
(Continued)

(51) Int. Cl.
*G11C 16/30* (2006.01)
*G11C 5/14* (2006.01)
(Continued)

(52) U.S. Cl.
CPC ............... *G11C 7/22* (2013.01); *G11C 5/148* (2013.01); *G11C 8/08* (2013.01); *G11C 16/26* (2013.01);
(Continued)

(58) Field of Classification Search
CPC ......... G11C 16/26; G11C 16/30; G11C 5/148; G11C 8/08; G11C 5/145
(Continued)

(56) References Cited

U.S. PATENT DOCUMENTS

| | | | |
|---|---|---|---|
| 4,460,835 A | 7/1984 | Masuoka | |
| 5,673,231 A * | 9/1997 | Furutani | G11C 29/02 365/189.11 |

(Continued)

FOREIGN PATENT DOCUMENTS

TW   201440178 A   10/2014

OTHER PUBLICATIONS

Wang, IEEE, "A 3us Wake-up Time Nonvolatile Processor Based on Ferroelectric Flip-Flops", Tsinghua National Laboratory for Information Science and Technology (2012), pp. 149-152.

*Primary Examiner* — Ly D Pham
(74) *Attorney, Agent, or Firm* — Kunzler Bean & Adamson

(57) ABSTRACT

Systems and methods for driving a non-volatile memory device in a standby operating condition are disclosed. A standby detection circuit detects whether the non-volatile memory system is in a standby condition. In response to determining that the non-volatile memory system is in a standby condition, a bias control circuit provides bias currents to drivers of the non-volatile memory system in a standby mode.

14 Claims, 8 Drawing Sheets

Related U.S. Application Data continuation of application No. 15/268,315, filed on Sep. 16, 2016, now Pat. No. 10,062,423, which is a continuation of application No. 14/966,990, filed on Dec. 11, 2015, now Pat. No. 9,449,655.

(60) Provisional application No. 62/212,296, filed on Aug. 31, 2015.

(51) Int. Cl.
    *G11C 16/26*     (2006.01)
    *G11C 7/22*     (2006.01)
    *G11C 8/08*     (2006.01)
    *G11C 16/04*     (2006.01)
    *G11C 16/32*     (2006.01)

(52) U.S. Cl.
    CPC .............. *G11C 16/30* (2013.01); *G11C 5/145* (2013.01); *G11C 16/0483* (2013.01); *G11C 16/32* (2013.01)

(58) Field of Classification Search
    USPC .................................................. 365/189.011
    See application file for complete search history.

(56) References Cited

U.S. PATENT DOCUMENTS

| | | |
|---|---|---|
| 5,903,197 A | 5/1999 | Kikugawa |
| 6,151,262 A | 11/2000 | Haroun et al. |
| 6,789,027 B2 | 9/2004 | Guliani et al. |
| 7,221,610 B2 | 5/2007 | Yamazoe et al. |
| 7,339,829 B2 | 3/2008 | Sarig |
| 7,606,106 B2 | 10/2009 | Yabe et al. |
| 7,821,866 B1 | 10/2010 | Raghavan et al. |
| 7,971,081 B2 | 6/2011 | Cooper et al. |
| 8,050,084 B2 | 11/2011 | Bae et al. |
| 9,449,655 B1 | 9/2016 | Zonte et al. |
| 2002/0001207 A1 | 1/2002 | Kishimoto et al. |
| 2005/0286322 A1 | 12/2005 | Choi et al. |
| 2006/0253718 A1 | 11/2006 | Kawase et al. |
| 2008/0279017 A1 | 11/2008 | Shimano et al. |
| 2008/0307240 A1 | 12/2008 | Dahan et al. |
| 2009/0097304 A1 | 4/2009 | Choi et al. |
| 2009/0129192 A1 | 5/2009 | Barth, Jr. et al. |
| 2009/0268531 A1 | 10/2009 | Nii et al. |
| 2010/0039872 A1 | 2/2010 | Park et al. |
| 2010/0157693 A1 | 6/2010 | Iwai et al. |
| 2011/0050436 A1 | 3/2011 | Tseng |
| 2011/0221483 A1 | 9/2011 | Liu et al. |
| 2012/0204048 A1 | 8/2012 | Kim et al. |
| 2013/0290759 A1 | 10/2013 | Kumar et al. |
| 2014/0013141 A1 | 1/2014 | Heo et al. |
| 2014/0239374 A1 | 8/2014 | Ramkumar et al. |
| 2014/0281599 A1 | 9/2014 | Grimsrud et al. |
| 2014/0281626 A1 | 9/2014 | Younger et al. |
| 2015/0162055 A1 | 6/2015 | Yoo et al. |
| 2015/0378409 A1 | 12/2015 | Dunstan et al. |

\* cited by examiner

LOW STANDBY POWER WITH FAST TURN ON METHOD FOR NON-VOLATILE MEMORY DEVICES

RELATED APPLICATIONS

This Application is a Continuation of U.S. patent application Ser. No. 16/055,570, filed on Aug. 6, 2018, now U.S. Pat. No. 10,510,387, issued on Dec. 17, 2019, which is a Continuation of U.S. patent application Ser. No. 15/268,315, filed on Sep. 16, 2016, now U.S. Pat. No. 10,062,423, issued on Aug. 28, 2018, which is a Continuation of U.S. patent application Ser. No. 14/966,990, filed on Dec. 11, 2015, now U.S. Pat. No. 9,449,655, which issued on Sep. 20, 2016, which claims the benefit of U.S. Provisional Application No. 62/212,296, filed on Aug. 31, 2015, all of which are incorporated by reference herein in their entirety.

BACKGROUND

Non-volatile memory devices are used in electronic components that require the retention of information when electrical power is unavailable. Non-volatile memory devices may include read-only-memory (ROM), programmable-read-only memory (PROM), erasable-programmable-read-only memory (EPROM), and electrically-erasable-programmable-read-only-memory (EEPROM) devices. Some memory arrays utilize transistors and gate structures which may include a charge trapping layer. The charge trapping layer may be programmed to store data based on voltages applied to or received by the memory array.

BRIEF DESCRIPTION OF THE DRAWINGS

The present disclosure is illustrated by way of example, and not of limitation, in the figures of the accompanying drawings in which.

DETAILED DESCRIPTION

Figure 1:
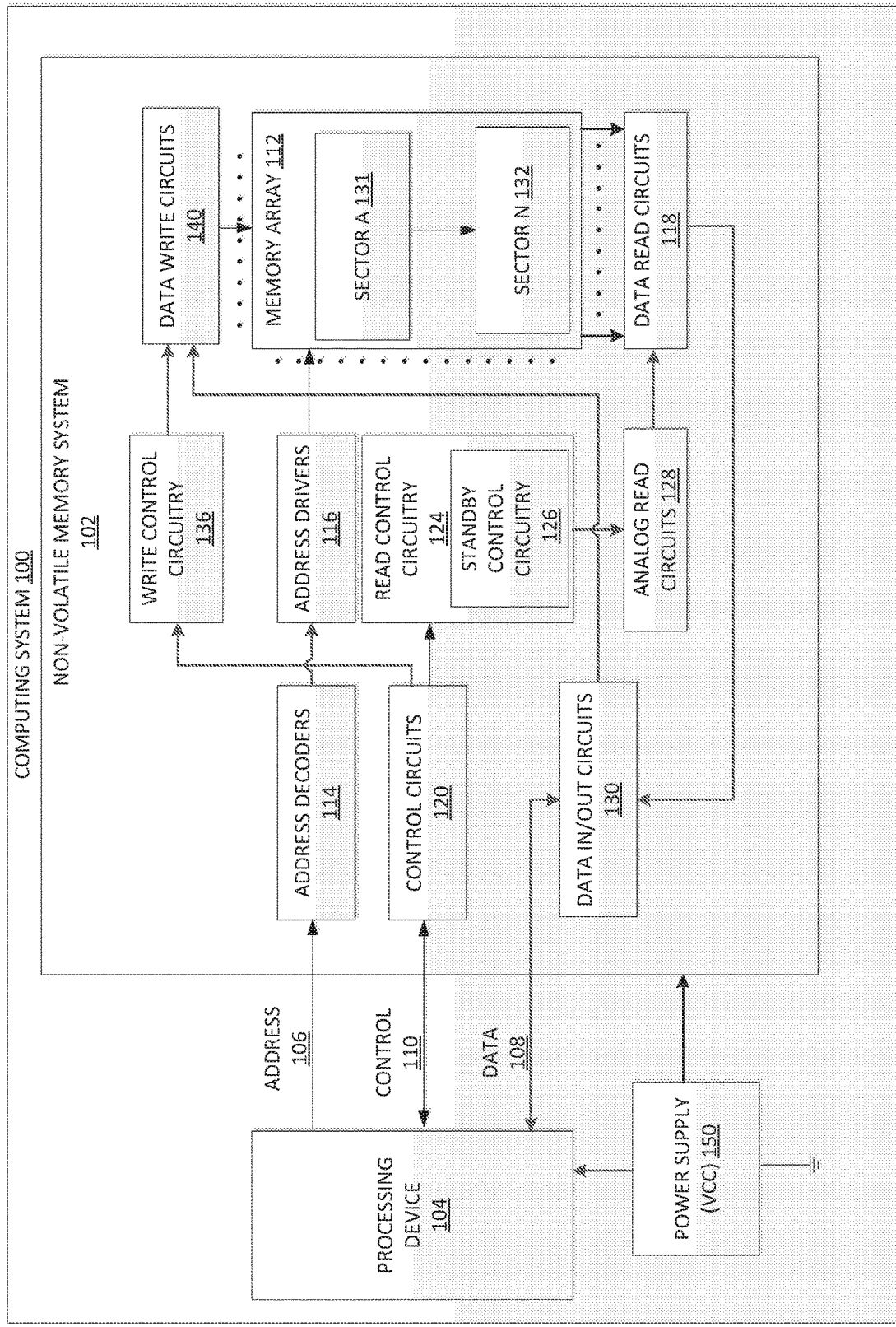
FIG. 1 is a block diagram illustrating a computing system including a non-volatile memory system, according to an embodiment.

Read operations for non-volatile memory (NVMs) devices may use analog circuits to provide biasing for sensing circuits, to generate boosting voltages for word-line and column drivers, as well as protection voltages for level shifters in a read path of the NVM device. In some imple-mentations, a NVM device may have an active operating condition and a standby operating condition. For example, a NVM device may enter a standby operating condition when no read or write instructions have been received by the NVM device for a set length of time. The standby operating condition may draw less power than an active operating condition, however, the lower current slows the operation of circuits in the NVM device and results in lower performance when performing read commands.

In order to transition from a standby operating condition to an active operating condition, analog circuits charge various capacitors and other circuit elements in the read path of the memory system. To avoid delays in a high speed read operation, the analog circuits in the read path may consume high standby currents such that few circuit elements will be charged when transitioning into an active mode.

On the other hand, providing large standby currents in standby operation of a memory system may consume too much power for certain applications. For example, lower power system-on-chip circuits may be used in applications having limited energy capacity to provide standby currents and sufficient life between charging or replacing batteries. Such applications may include wearable devices and Internet of Things applications where low power consumption extends the usefulness of the product or device. Devices with low power consumption may also benefit from fast powering up and waking up from a sleep state and fast transition to an active state from a standby state. A transition time from standby mode to active mode may be substantially instantaneous and may be similar to the propagation time of control signals in the memory system. For example, a fast transition from a standby state may be approximately 1 ns or less. Such a transition may be one or more orders of magnitudes faster than the read cycle time for the memory system (for example, 0.01-0.1 times the length of a read cycle time). Waking from a sleep state or powering up a device may be considered fast if accomplished on the order of microseconds (for example, 1-10 μs) because certain circuit elements may be charged from an inactive state. In some alternative embodiments, other lengths of time may be used to indicate a fast transition from standby mode to active mode and waking from a sleep state.

In some embodiments, control circuits operate at a low current in a standby operating condition, but provide substantially immediate transitions from the standby operating condition to an active operating condition, in particular when a read instruction is received. In one embodiment, the control circuits include a standby state detector and a start-up generator. A standby state detector may operate to determine when to enter or exit a standby state based on receiving read operations at the memory system. The standby state detector may operate in conjunction with a start-up generator that provides additional power when the memory system is turned on or wakes from a sleep state to control the circuits generating analog signals for read operations. The system may operate at low standby current when not in an active state.

FIG. 1 is a block diagram illustrating a non-volatile memory system, according to an embodiment. Computing system 100 may include a processing device 104 coupled to non-volatile memory system 102 via address bus 106, data bus 108, and control bus 110. In some embodiments, the computing system 100 may be a programmable system on a chip (PSoC) device or similar programmable system. The components of the computing system 100 have been simplified for the purpose of illustration, and not intended to be a complete description. In particular, details of the processing device 104, address decoders 114, address drivers 116, control circuits 120, write control circuits 136, data read circuits 118, and read control circuitry 124, are not described in detail herein. In some embodiments, the computing system 100 may include fewer or additional components than illustrated in FIG. 1. For example, computing system 100 may include one or more additional memory components such as RAM or ROM, may include various input or output ports or devices, or may include other components used by the computing system 100.

Power supply 150, is coupled to non-volatile memory system 102, also referred to simply as "memory system." Power supply 150 may be a power supply external to memory system 102 and may be used by memory system 102 to generate bias currents and voltages for providing power to a memory array 112 to read and write to the non-volatile memory. Power supply 150 may further provide power to processing device 104 or other components of the computing system 100.

Processing device 104 may reside on a common carrier substrate such as, for example, an integrated circuit ("IC") die substrate, a multi-chip module substrate, or the like. Alternatively, the components of processing device 104 may be one or more separate integrated circuits and/or discrete components. In one exemplary embodiment, processing device 104 is the Programmable System on a Chip (PSoC®) processing device, developed by Cypress Semiconductor Corporation, San Jose, Calif. Alternatively, processing device 104 may be one or more other processing devices such as a microprocessor or central processing unit, a controller, special-purpose processor, digital signal processor ("DSP"), an application specific integrated circuit ("ASIC"), a field programmable gate array ("FPGA"), or the like.

Memory system 102 includes memory array 112, which may be organized as rows and columns of non-volatile memory cells. Memory array 112 may be coupled to address drivers 116 via multiple select lines and read lines. For example, there may be one select line and one read line for each row of the memory array. The address drivers 116 may drive memory locations corresponding to addresses received over address bus 106. For example, the address decoders 114 may include a row decoder, a column decoder, and a sector decoder to decode addresses received from the processing device 104.

Address drivers 116 may be configured to select a first row of memory array 112 for a program operation by applying a voltage to a first select line in the first row and to deselect a second row of the memory array by applying another voltage to a second select line in the second row. Address drivers 116 may be further configured to select a memory cell in the first row for programming by applying a voltage to a first bit line in a first column, and to inhibit an unselected memory cell in the first row from programming by applying another voltage to a second bit line in a second column. Read control circuitry 124, in particular standby control circuitry 126, may be configured to apply a bias current to analog read circuits to control current provided by the address drivers 116 during read operations and during standby operation.

Memory array 112 may be further coupled to data read circuits 118 via multiple bit lines. Data read circuits 118 may include column multiplexers and sense amplifiers. Column multiplexers may select the memory columns to be accessed by sense amplifiers during a read operation. For example, the column multiplexers may provide access to multiple column lines in memory array 112 to enable sense amplifiers to read multi-bit words therefrom. Memory system 102 may further include control circuitry 120 to receive signals from processing device 104 and sends signals to read control circuitry 124 and write control circuitry 136. The read control circuitry 124 and write control circuitry 136 may then provide control for read and write operations of memory array 112. For example, the write control circuitry 136 may provide control of data write circuits 140, and the read control circuitry 124 may provide control of analog read circuits 128. Write control circuitry 136 may provide currents and voltage supplies to drivers of write path circuits of the memory array 112. For example, the write control circuitry 136 may comprise analog and digital circuits to provide high voltage to data write circuits 140 for writing data to memory array 112. Analog read circuits 128 provide bias currents and voltage supplies to drivers of read path circuits of the memory array 112, and control signals to data read circuits 118. Read circuitry 124 includes standby control circuitry 126 to generate and control standby and active operations of the memory system 102. The standby control circuitry 126 may provide bias currents to word-line and column drivers, as well as protection voltages for level shifters in the read path of the memory circuit.

Data written to the memory array 112 or read from the memory array 112 may be passed from the processing device 104 to the memory system 102 through a data bus 108. The memory system 102 may include data in/out circuits 130 that process the data passed to or from the processing device 104 from the memory system 102. For example, the data in/out circuits may include one or more data buffers for controlling communications between the processing device and the memory array 112.

Memory system 102 may be a storage device configured to store data values in various low-power and non-volatile contexts. Accordingly, memory systems as disclosed herein, such as memory system 102, may be implemented to have a relatively small area which may be fabricated using advanced processing nodes, such as a 65 nm node or lower. Moreover, as discussed in greater detail below, memory system 102 may include various memory cells to store data values. The memory cells may be implemented with a common source line to reduce the overall footprint of each memory cell.

Memory array 112 may include one or more memory sectors, such as sector A 131 though sector N 132. Each sector may have any number of rows and columns of memory cells, for example 4096 columns and 256 rows. Rows may include multiple memory cells arranged horizontally. Columns may include multiple memory cells arranged vertically.

Memory array 112 may also use data read circuits 118 to couple a column of memory cells in a sector to sense amplifiers during a read operations. For example, data read circuits 118 for column 0 of sector A 131 may be used as a switch to couple the memory cells of column 0 of sector A to sense amplifiers during a read operation.

It should be appreciated that terms "rows" and "columns" of a memory array are used for purposes of illustration, rather than limitation. In one embodiment, rows are conventionally arranged horizontally and columns are conventionally arranged vertically. In another embodiment, rows and columns of memory array 112 may be arranged in any orientation.

In one embodiment, a memory cell may be a two transistor (2T) memory cell. In a 2T memory cell, one transistor may be a memory transistor, while another transistor may be a pass transistor. In other implementations the memory cell may include another number of transistors, such as a single memory transistor (1T).

Memory array 112 may be implemented using charge trapping memory transistors. A memory array implemented using charge trapping memory transistors may be referred to as a charge trapping memory device. Charge trapping memory transistors may be implemented to utilize transistors and gate structures that include a charge trapping layer. The charge trapping layer may be an insulator that is used to trap charge. The charge trapping layer may be programmed to store data based on voltages applied to or received by the memory array 112. In this way, a memory array 112 may include various different memory cells arranged in rows and columns, and each memory cell may be capable of storing at least one data value (e.g., bit). Voltages may be applied to each of the memory cells to program the memory cell (e.g., program operation—store a logic "1"), erase the memory cell (e.g., erase operation—store a logic "0"), or read the memory cell (e.g., read operation).

In one embodiment, the charge trapping memory transistors may be implemented using different materials. One example of a charge trapping memory transistor is a silicon-oxide-nitride-oxide-silicon (SONOS) type transistor. A memory array implemented with SONOS type transistors may be referred to as a SONOS memory device. In a SONOS type transistor, the charge trapping layer of the memory transistor may be a nitride layer, such as a layer of silicon nitride. Moreover, the charge trapping layer may also include other charge trapping materials such as silicon oxy-nitride, aluminum oxide, hafnium oxide, hafnium aluminum oxide, zirconium oxide, hafnium silicate, zirconium silicate, hafnium oxy-nitride, hafnium zirconium oxide, lanthanum oxide, or a high-K layer. The charge trapping layer may be configured to reversibly trap or retain carriers or holes injected from a channel of the memory transistor, and may have one or more electrical characteristics reversibly changed, modified, or altered based on voltages applied to memory cell. In another embodiment, different types of charge trapping memory transistors may be used.

Figure 2:
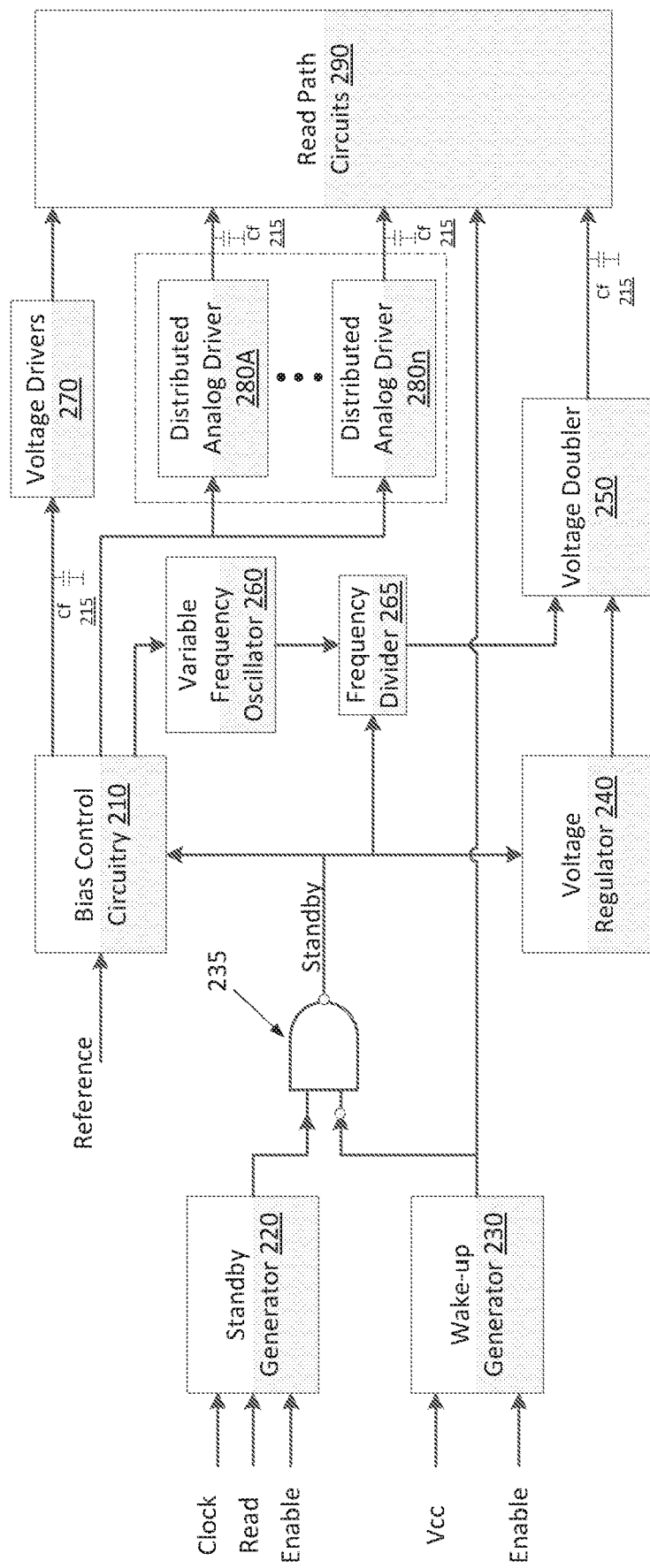
FIG. 2 is a block diagram illustrating standby control circuitry of a non-volatile memory system, according to an embodiment.

FIG. 2 is a block diagram illustrating standby control circuitry coupled to read path circuits 290, according to one embodiment. Standby control circuitry may include bias control circuitry 210 coupled to voltage drivers 270 (e.g., low voltage and high voltage drivers), variable frequency oscillator 260 to control voltage boost to read path circuits 290, and one or more analog drivers 280. Standby control circuitry may also include a standby generator 220, a wake-up generator 230, and logic element 235 for determining if a standby condition, wake condition, or power-up condition is detected.

The read path circuits 290 represent various circuits used to read from a memory array. For example, the read path circuits may include data read circuits 118 including column multiplexes and sense amplifiers, as well as data in/out circuits 130, address decoders 114, address drivers 116, or other elements of a memory system as described with reference to FIG. 1 for reading from a memory location. The additional elements shown in FIG. 2 illustrate various control and driving circuits for the read path circuits 290. For example, voltage drivers 270, distributed analog drivers 280, and voltage doubler 250 may be driving circuits of the read path circuits 290, and bias control circuitry 210 may be control circuits for one or more of the driving circuits.

Standby generator 220, may detect if a standby condition is met in the memory system. For example, the standby generator may comprise a standby detection circuit. The standby generator 220 may accept inputs of the clock, an enable input, and a read input. The read input may indicate when a read instruction is performed by the memory system. The standby generator 220 may determine if there has been a lapse in time since the last read request to the memory system. For example, the standby generator 220 may comprise standby detection circuits for determining when the memory system has entered a standby condition or when to enter a standby mode. If a threshold amount of time has passed since the last read instruction, the standby generator may produce an output indicating that a standby condition is met. For example, in some embodiments, the standby generator may generate a logical high value in response to determining that no read instruction has been received for a set number of clock cycles (3, 4, 5, 10, or any other number of cycles, for example). In some embodiments, a logic value of low may indicate a standby condition and a logic value of high may indicate an active condition. Once a read instruction and an associated clock is received by the control circuitry, the standby generator 220 will change its output to indicate that it is in an active mode. An example embodiment of a standby generator is discussed further below with respect to FIG. 3.

Wake-up generator 230 may provide additional current to read path circuits 290 in response to waking from a sleep mode, or powering on of the memory system. Thus, the wake-up generator 230 may reduce the time for initially charging the capacitors and other circuit elements in the read circuit path when the memory system is powered on or wakes from a sleep mode. For example, during a sleep state, various circuit elements of the memory system may not remain in a charged state. In order to wake-up from the sleep state, an increased current may be provided by the wake-up generator 230 to read path circuits 290. A similar process may be performed when the memory system is powered on, as various elements of the memory system may not be charged to operating conditions. Thus, the wake-up generator provides increased power to the read path circuits of a memory system in response to waking up from a sleep state or powering on of the memory system.

In addition to the wake-up generator, the bias control circuitry may also provide higher current to reduce wake-up or power-up time for the memory system. Thus, a logical output of the wake-up generator is provided to logic element 235. The output of the wake-up generator is thus used to ensure sufficient current is provided to read path circuits 290 during wake-up in addition to active modes. In some embodiments, the standby control circuitry may not include a wake-up generator. For example, certain embodiments of a memory system may provide limited power during standby and a fast transition for the time to transition to an active mode from a standby mode, but may not have required fast powering on or transitions from sleep mode. In such applications, a standby generator 220 may be provided in the standby control circuitry without the use of a wake-up generator 230. In some embodiments where that is the case, the standby generator is coupled to the bias control circuitry and may not utilize an intervening logic element 235.

Logic element 235, determines if the memory system is currently in a wake-up mode, start-up mode, or active mode and if the memory system is operating in one of these modes produces an output to the bias control circuitry 210, frequency divider 265, and regulator 240 (e.g. a low drop out, switching regulator, or the like) indicating that the memory system is to operate in an active mode, which provides increased current to read path circuits 290. As shown in FIG. 2, the logic element 235 is shown as a NAND gate accepting an input from the standby generator 220 and the wake-up generator 230. The input from the wake-up generator may be inverted, such that a logic high is associated with the wake-up generator not operating and a logic low is associated with the wake-up generator in operation. Thus, the logic element 235 will produce a logic low output if the standby generator is a logic high and the inverse of the output from the wake-up generator is a logic high. In other conditions the output of the logic element 235 will be a logic high. As such, the logic element 235 may generate a logic low output if the standby generator 220 indicates that the memory system is in a standby condition and the wake-up generator is not in operation. Therefore, a logic low output of the NAND gate will indicate to the bias control circuitry 210, the frequency divider 265, and the voltage regulator 240 to operate in standby mode and to operate in active mode if the output of the logic element 235 is a logic high. In various embodiments, the logic element 235 may be implemented with a different logical element. For example, the logic element may be an AND gate and a logic high output would indicate to the coupled circuits to operate in a standby mode. Other implementations with AND, NAND. NOR, and OR, gates may be implemented as well. In FIG. 2, the logic output of wake-up generator 230 is inverted before the circuit element 235, however, in some embodiments, the wake-up generator may produce a logic output separate from the driving output that is inverted. In such embodiments, the inversion prior to logic element 235 is not required. In some embodiments, the logic high and logic low of one or both of the standby generator and wake-up generator 230 may be reversed and a different logic element 235 may be used to determine if the memory system is in one of an active, wake-up, or start-up mode.

Bias control circuitry 210 provides bias currents or control signal voltages to bring the memory system from a standby state to an active state. For example, the bias control circuitry 210 may provide a bias current to variable frequency oscillator 260 to control the frequency of oscillations provided to a voltage doubler 250. The bias control circuitry 210 may also provide a bitline limit voltage to one or more distributed analog drivers 280. In some embodiments, the bias control circuitry 210 may also provide a protection voltage to voltage drivers 270. In some embodiments, the bias control circuitry may adjust bias currents and voltages to fewer or additional components than shown in FIG. 2. For example, in some embodiments, the bias control circuitry 210 may not provide a protection voltage to voltage drivers.

Figure 4:
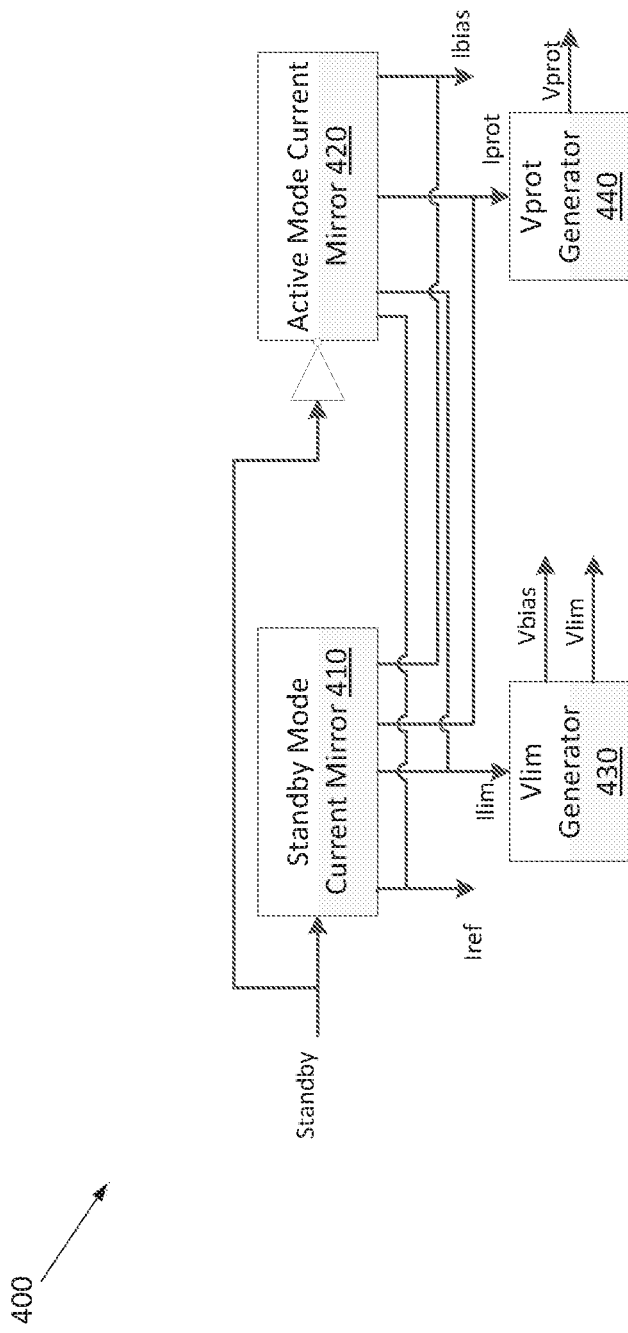
FIG. 4 is a block diagram illustrating bias control circuitry, according to an embodiment.

The bias control circuitry may comprise multiple current mirrors for providing bias currents in different operating conditions. For example, the bias control circuitry may provide a first set of current mirrors that provide standby bias currents and a second set of current mirrors that provide active bias currents. An example embodiment of bias control circuitry is illustrated in FIG. 4 and is discussed further below.

Voltage double 250 may operate to provide a boost voltage to read path circuits 290. For example, the power supply for the memory system may operate at a low voltage (e.g., 1.2 Volts), but various operations of the memory system may operate at a higher voltage (e.g., 2.4 Volts). Thus, a voltage doubling circuit may be provided to generate a higher voltage to read path circuits 290. In some embodiments, the boost voltage is provided to address drivers to drive areas of the memory array corresponding to an address received from a processing device. The voltage doubler may draw significant current during active operation of the memory system, but may be drive read path circuits with lower current during standby operation. For example, the lower current may operate at a level to charge a filter capacitor to maintain the voltage level to read path circuits 290, but not at a current to quickly drive the read path circuits 290 as in active operation. The voltage doubler 250 may receive an input voltage from a voltage regulator 240 and a control signal for switching from variable frequency oscillator 260 and frequency divider 265.

The voltage doubler 250 may receive a lower oscillation frequency during standby operation than in active operation of the memory system. The lower frequency results in slower switching of the circuits in the voltage doubler 250 and therefore draws less current than operating at higher frequencies. As an example, a variable frequency oscillator 260 may operate in active mode with a frequency around 50 MHz. During active operation, the frequency divider 165 is not active and the voltage doubler 250 is switched according to that frequency. In standby operation the bias current to variable frequency oscillator 260 is reduced and a lower frequency is output. Continuing from the example above, the frequency may be reduced from 50 MHz to approximately 8 MHz. The frequency may be further reduced by a frequency divider 265. For example, the 8 MHz output may be reduced by a factor of 8 to approximately 1 MHz by the frequency divider. In some embodiments, the control circuitry may not include a frequency divider 265, but may operate based only on the variable frequency oscillator 260. In some embodiments, a fixed frequency oscillator may be used, and the frequency may be reduced only be a frequency divider 265.

Distributed analog drivers 280A-280$n$ operate to provide driving voltages and currents to read path circuits 290. In some embodiments, the read path circuits 290 may receive driving voltages and currents from a single analog driver instead of multiple distribute drivers as shown in FIG. 2. The distributed analog drivers 280A-280$n$ may reduce the current output to the read path circuits 290 in response to bias currents and voltage received from bias control circuitry 210. For example, bias control circuitry may provide a lower current to the bitline limit voltage to the analog drivers in standby operation. Thus, the distributed analog drivers 280A-280$n$ may provide enough current to maintain charge on one or more capacitors or other elements to provide fast switching to active operation from standby, but not providing additional power to the read path circuits 290.

Similarly, the protection voltage provided to voltage drivers 270 may be provided at a lower current to reduce power consumption by the drivers feeding the read path circuits 290. Voltage drivers 270 may operate as voltage level shifters to shift from a low voltage control signal to a higher voltage for driving memory cells in the memory array during a read operation. The protection voltage provided to the voltage drivers 270 may prevent certain over-voltage conditions from damaging one or more circuits in the memory system. During standby operation, the protection voltage may be provided at a low current to maintain the protection voltage level supplied to the voltage drivers 270. The current of the protection voltage may be increased during active operation of the memory system to protect the voltage drivers 270 during potential over-voltage events.

Figure 3A:
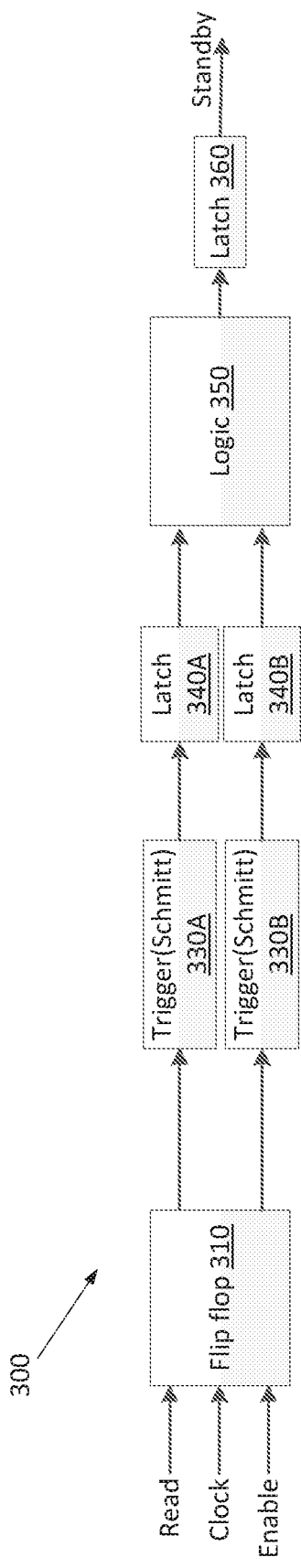
FIG. 3A is a block diagram illustrating circuitry of a standby generator, according to an embodiment.

FIG. 3A depicts a block diagram of standby detection circuitry for a standby generator. For example, the circuitry may be implemented as a standby generator 220 as used in the example embodiment of FIG. 2. As discussed above, the standby generator generates a signal to indicate a standby condition of the memory system. In some embodiments, the standby generator determines that the memory system is in a standby condition in response to a lapse in time since the previous read instruction. The standby generator may include two parallel paths for both rising and falling edges of the clock signal. The standby generator may begin with an input of a read signal and a clock signal to flip flop 310. A logic high read signal may be provided to the standby generator when the memory system is not performing a read operation. For example, when the memory system is performing write operations, the read signal may be a logic low value. When the standby generator receives a logic low read signal, it may provide a logic low output value indicating an active condition. This enables the circuits to operate at an active current level as may be required by other operations performed by the memory system. For example, the oscillator may operate at an active current level during write operations, so the standby generator provides an indication to operate in active mode when read operations are not performed. A high read signal may precede an active clock signal in response to a read instruction to the memory system. The control circuitry may transition the memory system to operating in an active mode in response to pulses on the clock signal. In some embodiments the flip flop 310 may be a d-type flip flop. The flip flop 310 outputs a signal from the rising edge and the falling edge of the input signal to a series of circuit components for conditioning the signal. In particular, the signal passes through triggers 330A-330-B and latches 340A-340B. The triggers 330 may be Schmitt triggers in some embodiments. The triggers remove noise from the signal to produce steady high and low logic levels. The latches 340 hold the output of the triggers for use by logic circuits 350. The logic circuits 350 determine if the signals indicate that the memory system is in a standby condition and produce a logic output on latch 360 that is distributed as discussed with reference to FIG. 2 above.

In some embodiments, the logic circuits 350 determine if there has been a predetermined gap since the last read instruction executed by the memory system. For example, the logic circuit may maintain the most recent set of signals and determine that the memory system is in an active condition if any of the signals are logic high. In some embodiments, this may be implemented by passing the signals received from latches 340 through a series of cascaded flip flops on each clock cycle and performing a logical OR on the outputs of the flip flops. This operates similar to a shift register to maintain a memory of the most recent signals received by the standby generator. Thus, if any of the recent values of the read input indicated logic high, the standby generator will output an indication that the memory system is in an active condition, but otherwise will indicate that it is in a standby condition. For example, to determine if there has been a read operation in the previous three clock cycles, the red signal may be input into three cascaded flip flops. In such a configuration, the most recent signal is on a first flip flop, the signal before is on the second flip flop, and the signal from two clock cycles ago is on the third flip flop. The output of the three flip flops may be passed to an OR gate to determine if any of the outputs indicate a read instruction. If none of the flip flops indicate a logic high value representing a read instruction, then there has not been a read instruction for three clock cycles. In such circumstances, the logic may return an indication to enter or remain in standby mode. In other situations, the logic may return an indication to enter or reaming in active mode.

Figure 3B:
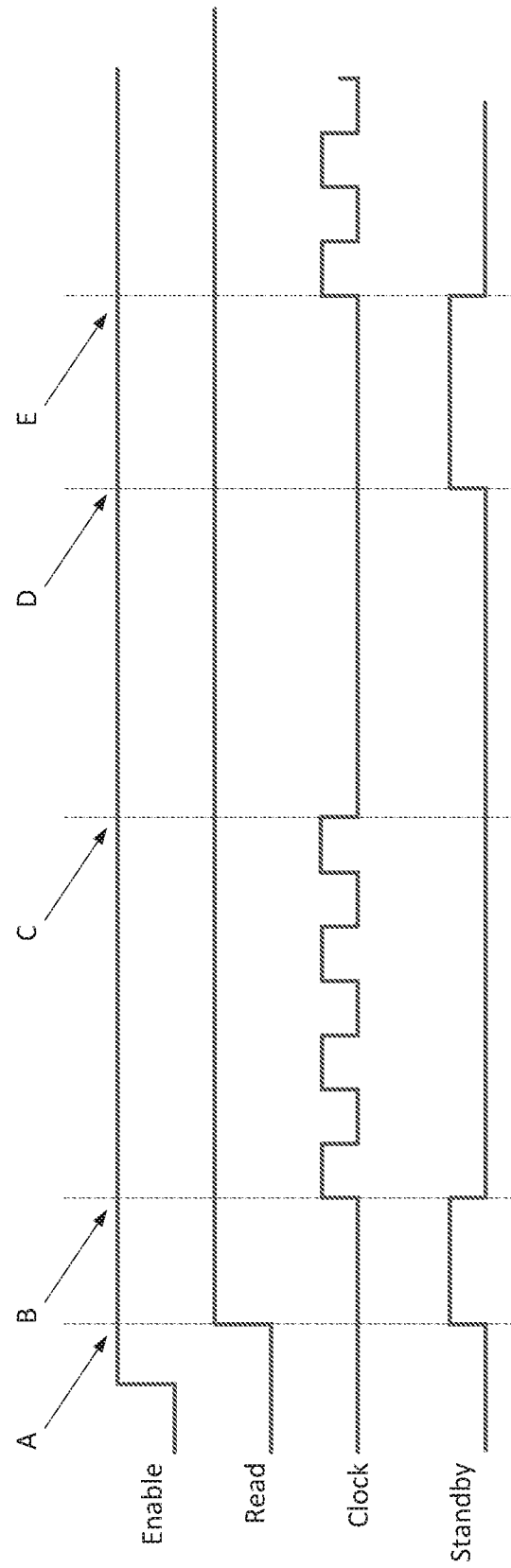
FIG. 3B is a timing diagram illustrating operation of a standby generator, according to an embodiment.

FIG. 3B is an example embodiment of a timing diagram of signals input into a standby generator and the output of the standby generator. In the example of FIG. 3B, the "Read" input indicates that a read operation may be performed as soon as a clock signal is present. The standby generate may provide a "standby" output with a logic high value when the memory system is in a standby mode and a logic low value when the memory system is in an active mode. At the beginning of the timing diagram, the read input has not been active, and the standby generator is outputting a logic low value indicating that the memory system is in an active condition. For example, the standby output may be provided as a logic low value to enable circuits to operate in active condition for other operations of the memory device. At time A, the read input is transitioned from a logic low value to a logic high value indicating that the memory system is activated for a read instruction. Because the standby generator has not received a clock input, the standby generator immediately changes the standby output to a logic high value to indicate a standby condition. At time B, the clock is activated for a read instruction of the memory system. The standby generator immediately changes the standby output to a logic low value to indicate an active condition. During the time period when the read instruction is processing, the clock cycles and the standby generator maintains an output indicating the active condition. At time C, the clock is deactivated and no read instruction occurs, but the standby generator maintains the active condition. At time D, the standby generator determines that a read has not occurred for a predetermined amount of time and outputs a signal indicating the memory system is in a standby condition. The standby condition is ended at time E when the clock signal is applied to the standby generator. The standby generator provides a standby output with a logic low value indicating that the memory system is in an active mode.

In the example of FIG. 3B, the time between C and D may be determined based on the system's clock. For example, the time may be based on a set number of clock cycles that run indicating no read operation before entering a standby mode. In some embodiments, the standby generator may wait three clock cycles indicating that there has not been a read operation before outputting a standby condition. For example, if a clock cycle is approximately 30 ns, the time between C and D on the timing diagram may be approximately 100 ns. In some embodiments, the time may be shorter or longer than shown in FIG. 3B. In addition. FIG. 3B is not necessarily drawn to scale.

FIG. 4 is a block diagram of bias control circuitry as used in an embodiment. The bias control circuitry may include a standby mode current mirror 410, an active mode current mirror 420, a Vlim generator 430 to generate a bitline limit voltage and a voltage generator 440 (labeled Vprot generator) to generate a protection voltage for one or more voltage drivers. The standby mode current mirror 410 and active mode current mirror 420 may receive an input of the standby generator's output. The active mode current mirror 420 may use the inverse of the standby input to determine its operating mode.

Standby mode current mirror 410 and active mode current mirror 420 may provide outputs to the same circuits at different currents. For example, the current mirrors may provide a current for the bitline limit voltage (Ilim), a protection voltage (Iprot), a bias current for the variable oscillator (Ibias), and a current for reference voltages (Iref). In some embodiments, the currents from the standby mode current mirror 410 may be significantly smaller than those generated by active mode current mirror 420. For example, the standby currents may be 10 times or more smaller than those of the active currents. In some embodiments, the bias current during active mode may be approximately 3 uA, while the bias currents during standby mode may be approximately 300 nA. In some embodiments, the standby mode current mirror 410 or the active mode current mirror 420 may generate different currents for each of the outputs. For example, the bitline limit current, the protection current, and the bias current may not be the same value.

The Vlim generator 430 and the protection voltage generator 440 generate voltages for use in the memory system. The output of the Vlim generator 430 may be a drive bias voltage and a voltage limit output as shown for use by the distributed analog drivers. Thus, the current supplied by the current mirrors determines the current of the voltages provide to the analog drivers. The protection current generated by the Vprot generator 440 may be used by the high voltage and low voltage drivers operating the read path circuitry of the memory system. Similar to the Vlim generator 430, the output of the Vprot generator 440 may be a consistent voltage, but the current level provided at that voltage may increase based on whether the standby mode current mirror 410 or the active mode current mirror 420 is operating. In some embodiments, the standby mode current mirror 410 operates in active operating mode and standby operating mode and the active mode current mirror 420 is the only used when in an active condition as determined by the standby generator.

Figure 5:
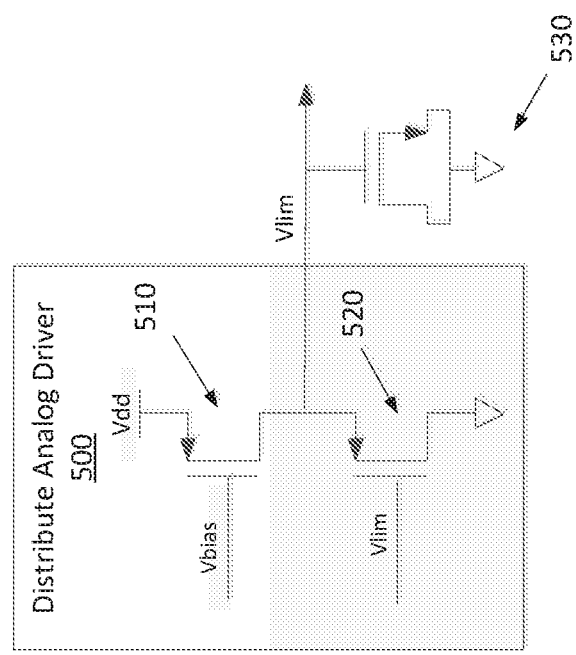
FIG. 5 is a block diagram illustrating circuitry of an analog driver, according to an embodiment.

FIG. 5 is a block diagram showing the operation of distributed analog drivers, as used in an embodiment. The distributed analog drivers may be connected to various sectors of the memory system. For example, there may be a driver for each sector, or each driver may be coupled to a subset of sector of the memory system. In some embodiments, there may be more than one analog driver associated with particular memory sectors. FIG. 5 shows a PMOS controlled current source 510 and a PMOS follower 520. The PMOS controlled current source 510 receives a drive bias input and the PMOS follower 520 receives a bitline limit input voltage. For example, these voltages may be generated as described in FIG. 4. The output voltage Vlim may be substantially constant in active and standby operation of the memory system. The current of Vlim, however, may be higher during an active condition of the memory system compared to the standby condition of the memory system. For example, in standby operation of the memory system, the current may be adjusted such that it maintains the charge of a filter capacitor 530. Thus, the transition to active mode from standby mode is fast as the capacitors in the circuit are charged and increasing current provided by the bias control circuits provides the current to the memory system immediately.

Figure 6:
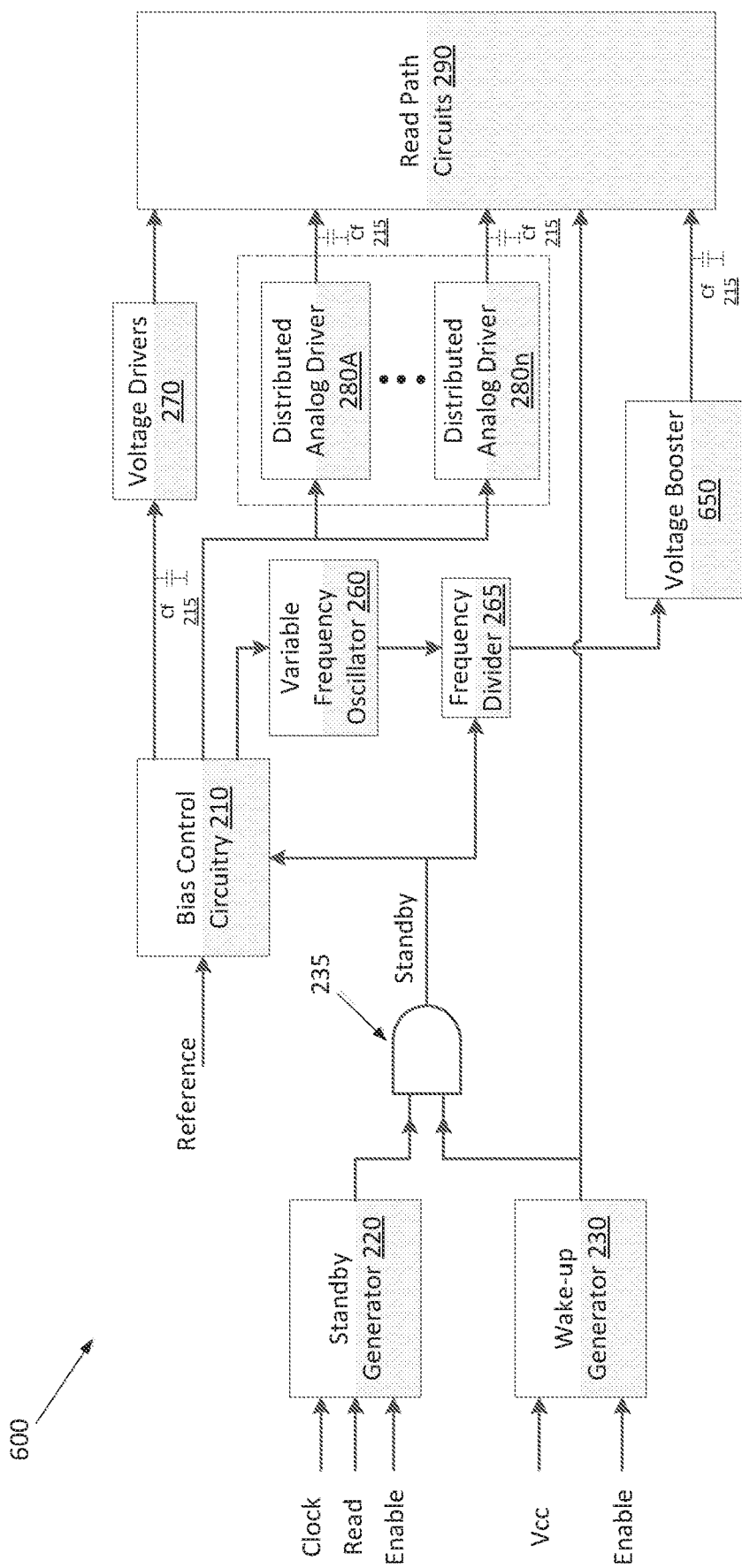
FIG. 6 is a block diagram illustrating another embodiment of standby control circuitry of a non-volatile memory system, according to an embodiment.

FIG. 6 is a block diagram illustrating standby control circuitry coupled to read path circuits 290, according to one embodiment. The embodiment in FIG. 6 operates similar to that in FIG. 2, however, instead of a voltage doubler, the control circuitry uses a voltage booster 650 to generate a boost voltage for the read path circuits 290.

Figure 7:
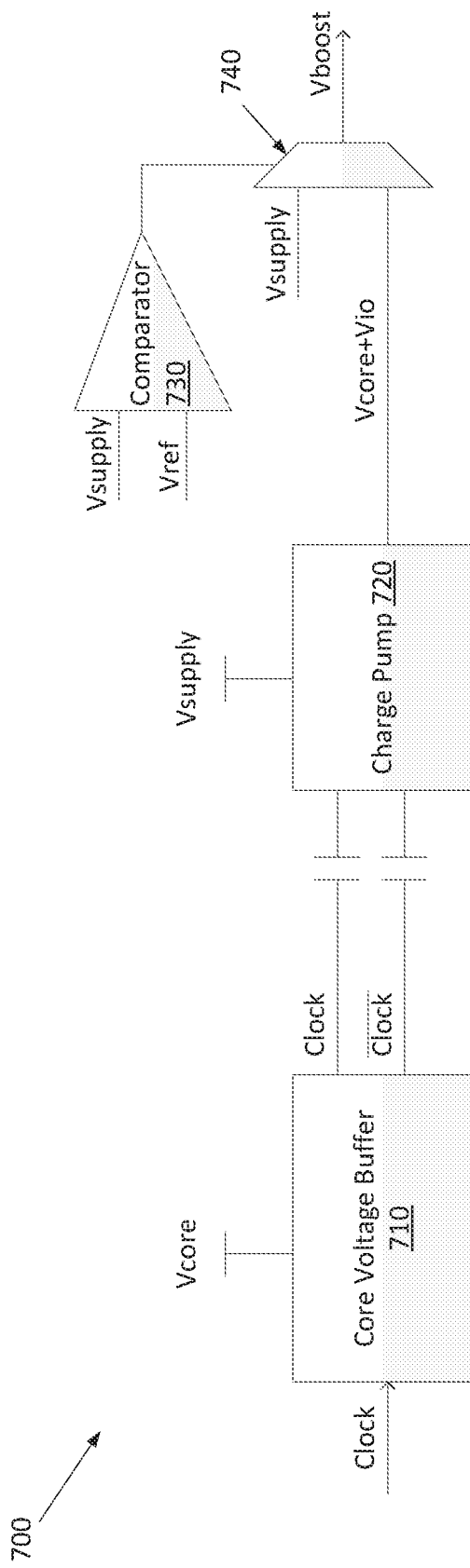
FIG. 7 is a block diagram illustrating circuitry of voltage booster, according to an embodiment.

FIG. 7 is a block diagram showing a voltage booster 700 as used in an embodiment. The voltage booster contains a comparator 730 that determines if the supply voltage is greater than a reference voltage. If the supply voltage is greater than reference voltage, the voltage booster will provide the supply voltage to the read path circuits. If the voltage supply is less than the reference voltage, the voltage booster will provide a voltage from a charge pump 720. For example, the output of comparator 730 as shown in FIG. 7 is provided to a multiplexer that provides Vsupply as Vboost if the output of comparator 730 indicates that Vsupply is greater than the reference voltage, and provides the output of charge pump 720 otherwise.

The charge pump 720 may add the supply voltage to a core voltage received from a core voltage buffer 710. The clock to the charge pump is connected to the core voltage. This generates the voltage of supply voltage plus core voltage, which is provided to a multiplexer 740 from the charge pump 720. The charge pump therefore generates at least a minimum sufficient voltage to supply to the memory system for proper functioning. For example, in some embodiments, the reference voltage for comparison is 2.5V. Thus, the multiplexer will provide the supply voltage if it is over 2.5V. or the supply voltage plus the core voltage if the supply voltage is less than 2.5V. In addition, the charge pump provides a maximum voltage of core voltage plus supply voltage. Limiting the maximum voltage may prevent damage to memory circuits from potential over voltage effects. Similar to the operation of the voltage doubler described with reference to FIG. 2, the current used by the charge pump during 720 during standby mode may be reduced by lowering the frequency provided by the variable frequency generator and the frequency divider. In some embodiments, instead of a voltage doubler or a charge pump, the control circuitry may use a pulsed voltage supply for the boost voltage, or may use a single voltage level across the memory system such that a boost voltage is not used by the circuitry.

Although generally described herein with reference to detecting a standby state of a memory system, the standby control circuitry may be used in other applications. For example, any circuit with low power standby requirements and fast transitioning to active mode may utilize similar circuits. For example, a System Resources Sub-System (SRSS) controlling operations of a system on a chip may benefit from a low power standby mode of control circuits during periods of inactivity, but may start up fast when the chip is used again. For example, the start-up time may be substantially instantaneous.

Figure 8:
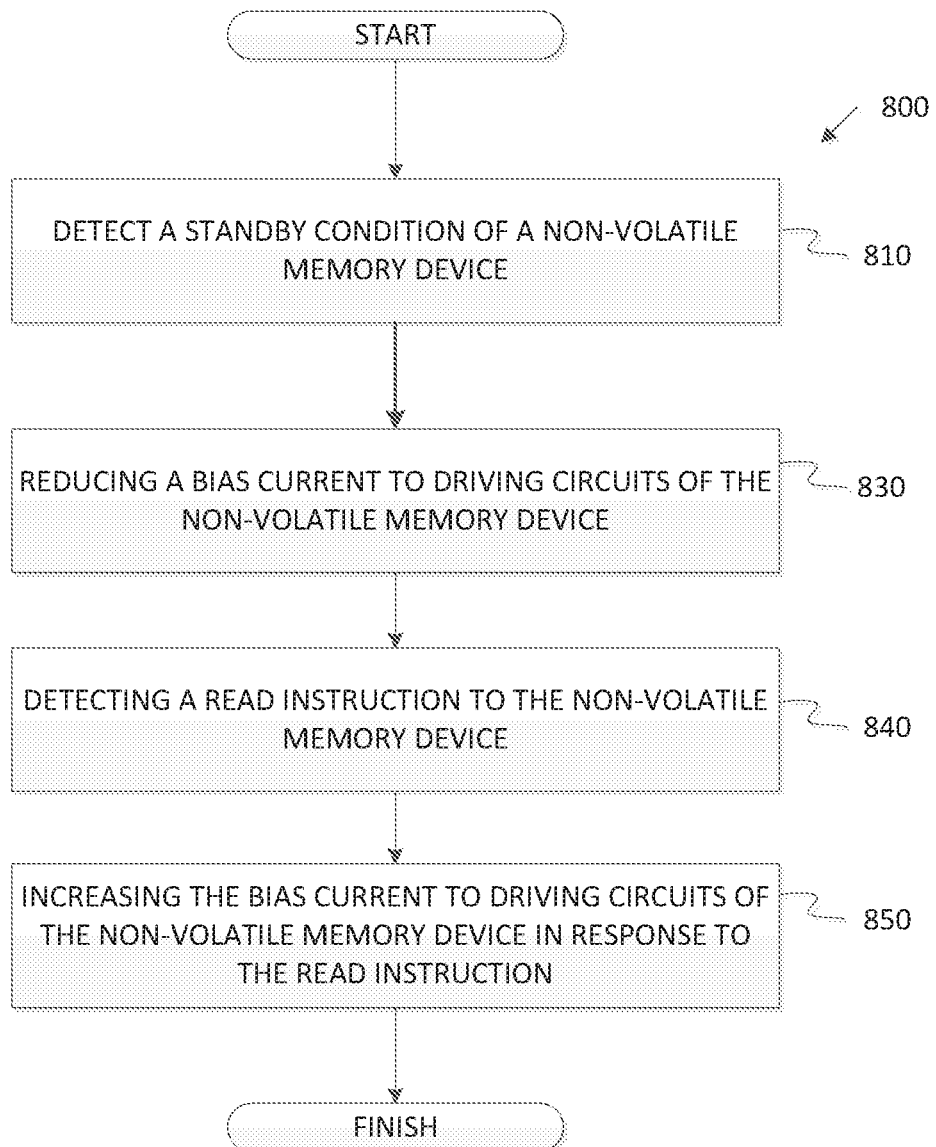
FIG. 8 is a flow diagram of processes of transitioning into and out of a standby mode, according to an embodiment

FIG. 8 is a flow diagram of processes of transitioning into and out of a standby mode, according to an embodiment. Beginning in block 810, standby control circuitry detects a standby condition of a non-volatile memory system. For example, the control circuitry may detect the condition with the standby generator as described with reference to FIGS. 2, 3A, and 3B. Detecting a standby condition in block 810 may also include determining that the memory system is not in a wake-up condition from a sleep state or a start-up condition from powering on the device.

Moving on to block 820, the standby control circuitry reduces a bias current to driving circuits of the non-volatile memory system. For example, currents may be reduced to variable oscillators, analog drive circuits, and voltage drivers from the bias control circuitry as described with reference to FIGS. 2 and 4. After the bias currents have been reduced, the memory system may be considered to be in a standby mode. The power consumed by the memory system is lower in standby mode than in an active mode where the memory is being accessed. When in standby mode the current to the read path circuits may be minimal and result in maintain charging of capacitors in the read path and filter capacitor to maintain voltage levels.

When in standby mode, the standby generator maintains an indication of standby mode until a read instruction is detected. In block 830, a read instruction to the non-volatile memory system is detected. For example, the control circuitry may detect the condition with the standby generator as described with reference to FIGS. 2, 3A, and 3B. When the read instruction is detected, the standby generator may change the output to indicate to bias control circuitry to increase bias currents and provide additional current to the read paths of the memory system.

In block 840, the current control circuitry increases the bias currents to driving circuits of the non-volatile memory system. The bias currents may be increased by operating additional current mirrors to output additional current to driving circuits of the memory system. In some embodiments, the processes described in FIG. 8 may be performed in a different order. In addition, the control of current and power consumption by the memory system may include fewer or additional processes than shown in the flow diagram of FIG. 8.

Embodiments of the present invention include various operations described herein. These operations may be performed by hardware components, software, firmware, or a combination thereof.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. The terms "first," "second," "third," "fourth," etc. as used herein are meant as labels to distinguish among different elements and may not necessarily have an ordinal meaning according to their numerical designation.

The above description sets forth numerous specific details such as examples of specific systems, components, methods, and so forth, in order to provide an understanding of several embodiments of the present invention. It may be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

What is claimed is:

1. An apparatus comprising:
   a non-volatile memory device;
   a standby control circuit coupled to the non-volatile memory device, the standby control circuit including:
      a standby detection circuit to detect a standby condition; and
      an active mode detection circuit to detect a read, program, or erase mode;
   a bias control circuit comprising:
      a first current mirror coupled to the standby detection circuit; and
      a second current mirror coupled to the active mode detection circuit; and
   a bitline limit voltage generator, wherein the first current mirror and second current mirror provide at least one current for the bitline limit voltage generator in response to receiving an output from the standby detection circuit or at least one output from the active detection circuit.

2. The apparatus of claim 1, further including a protection voltage generator coupled to said active mode detection circuit to generate a protection voltage for one or more voltage drivers.

3. The apparatus of claim 2, wherein said first and second current mirror provide outputs to same circuits at different currents.

4. The apparatus of claim 3, wherein said first current mirror operates in an active operating mode and standby operating mode and the second mode current mirror is only used when in an active condition as determined by a standby generator.

5. The apparatus of claim 1, wherein the first and second current mirror receive an input from a standby generator.

6. The apparatus of claim 1, wherein said first and second current mirror provide outputs to same circuits at different currents.

7. The apparatus of claim 1, wherein the currents from the first current mirror may be significantly smaller than currents by generated by said second current mirror.

8. The apparatus of claim 1, wherein said first current mirror operates in an active operating mode and standby operating mode and the second mode current mirror is only used when in an active condition as determined by a standby generator.

9. A system comprising:
   a non-volatile memory device;
   a standby control circuit coupled to the non-volatile memory device, the standby control circuit comprising:
      a standby detection circuit to detect that the non-volatile memory device is in a standby condition; and
      an active mode detection circuit to detect that the non-volatile memory device is in at least one of read, program, or erase modes;
   a bias control circuit comprising:
      a first current mirror coupled to the standby detection circuit; and
      a second current mirror coupled to the active mode detection circuit; and
   a bitline limit voltage generator coupled to the first and second current mirror, wherein the first and second current mirrors provide at least two values of current for the bitline limit voltage generator in response to receiving an output from the standby detection circuit or at least one output from the active detection circuit.

10. The system of claim 9 further including a protection voltage generator coupled to said active mode detection circuit to generate a protection voltage for one or more voltage drivers.

11. The system of claim 9, wherein the first and second current mirror receive an input from a standby generator.

12. The system of claim 9, wherein said first and second current mirror provide outputs to same circuits at different currents.

13. The system of claim 9, wherein the currents from the first current mirror may be significantly smaller than currents by generated by said second current mirror.

14. The system of claim 9, wherein said first current mirror operates in an active operating mode and standby operating mode and the second mode current mirror is only used when in an active condition as determined by a standby generator.

* * * * *